(12) United States Patent
Hoshi et al.

(10) Patent No.: US 10,930,775 B2
(45) Date of Patent: Feb. 23, 2021

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Yasuyuki Hoshi, Matsumoto (JP); Yuichi Hashizume, Matsumoto (JP); Keishirou Kumada, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 22 days.

(21) Appl. No.: 16/583,378

(22) Filed: Sep. 26, 2019

(65) Prior Publication Data

US 2020/0020796 A1 Jan. 16, 2020

Related U.S. Application Data

(63) Continuation of application No. PCT/JP2018/031238, filed on Aug. 23, 2018.

(30) Foreign Application Priority Data

Oct. 17, 2017 (JP) .............................. JP2017-201312

(51) Int. Cl.
*H01L 29/78* (2006.01)
*H01L 21/04* (2006.01)
(Continued)

(52) U.S. Cl.
CPC ...... *H01L 29/7811* (2013.01); *H01L 21/0465* (2013.01); *H01L 21/761* (2013.01);
(Continued)

(58) Field of Classification Search
CPC . H01L 21/0465; H01L 21/761; H01L 21/765; H01L 29/0623; H01L 29/0696;
(Continued)

(56) References Cited

U.S. PATENT DOCUMENTS

2012/0104415 A1 5/2012 Kaguchi et al.
2012/0273884 A1* 11/2012 Yedinak .............. H01L 29/0878
257/341

(Continued)

FOREIGN PATENT DOCUMENTS

JP 2011-054813 A 3/2011
JP 2011-061064 A 3/2011
(Continued)

*Primary Examiner* — Allan R Wilson
(74) *Attorney, Agent, or Firm* — Rabin & Berdo, P.C.

(57) ABSTRACT

A silicon carbide semiconductor device has a rectangle-shaped active region in which a main current flows, and a termination region surrounding the active region in a plan view. The device includes a silicon carbide semiconductor substrate of a first conductivity type, a first semiconductor layer of the first conductivity type on the front surface of the substrate, a second semiconductor layer of a second conductivity type, at a surface at the first semiconductor layer, a first semiconductor region of the first conductivity type, selectively provided in the second semiconductor layer, the second semiconductor region disposed from a periphery of the active region to reach the termination region, and extending along each of directions of four sides of the active region. At the four sides of the active region, a cross-sectional structure of each layer and each region of the device is identical to one another.

6 Claims, 17 Drawing Sheets

(51) Int. Cl.
| | |
|---|---|
| *H01L 21/761* | (2006.01) |
| *H01L 21/765* | (2006.01) |
| *H01L 29/06* | (2006.01) |
| *H01L 29/10* | (2006.01) |
| *H01L 29/16* | (2006.01) |
| *H01L 29/40* | (2006.01) |
| *H01L 29/66* | (2006.01) |

(52) U.S. Cl.
CPC ........ *H01L 21/765* (2013.01); *H01L 29/0623* (2013.01); *H01L 29/1095* (2013.01); *H01L 29/1608* (2013.01); *H01L 29/402* (2013.01); *H01L 29/66068* (2013.01); *H01L 29/7813* (2013.01)

(58) Field of Classification Search
CPC .............. H01L 29/1095; H01L 29/1608; H01L 29/402; H01L 29/4238; H01L 29/66068; H01L 29/7811; H01L 29/7813
See application file for complete search history.

(56) References Cited

U.S. PATENT DOCUMENTS

2016/0181408 A1* 6/2016 Aichinger ........... H01L 29/4238
257/77
2017/0301788 A1 10/2017 Fukui et al.

FOREIGN PATENT DOCUMENTS

| JP | 2012-094669 A | 5/2012 |
| JP | 2012-256662 A | 12/2012 |
| JP | 2015-095578 A | 5/2015 |
| JP | 2016-009728 A | 1/2016 |
| WO | 2016/047438 A1 | 3/2016 |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This is a continuation application of International Application PCT/JP2018/031238 filed on Aug. 23, 2018 which claims priority from a Japanese Patent Application No. 2017-201312 filed on Oct. 17, 2017, the contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

Silicon carbide is chemically a very stable semiconductor material, has a wide bandgap of 3 eV, and can be used very stably as a semiconductor material even at high temperatures. Further, silicon carbide has a critical field strength that is at least ten times greater than the critical field strength of silicon and therefore, is expected to be a semiconductor material capable of sufficiently reducing ON resistance. Such characteristics of silicon carbide are shared by other wide bandgap semiconductor materials that have a wider bandgap than that of silicon such as, for example, gallium nitride (GaN). Therefore, use of a wide bandgap semiconductor material enables semiconductor devices of higher voltages.

In such a high-voltage semiconductor device, high voltage is not only applied to an active region in which an element structure is formed and through which current flows in an ON state but is also applied to an edge termination region that surrounds a periphery of the active region and sustains breakdown voltage, and electric field concentrates in the edge termination region. The breakdown voltage of a high-voltage semiconductor device is determined by an impurity concentration, a thickness, and electric field strength of the semiconductor material; and in this manner, breakdown capability, which is determined by inherent characteristics of the semiconductor material, is equal across the active region and the edge termination region. Therefore, application of an electrical load that exceeds the breakdown capability in the edge termination region due to electric field concentration in the edge termination region may lead to destruction. In other words, the breakdown voltage of a high-voltage semiconductor device is rate limited by the breakdown capability of the edge termination region.

FIG. 16 is a top view of a structure of a conventional silicon carbide semiconductor device. A silicon carbide MOSFET (hereinafter, SiC-MOSFET) is taken as an example of a silicon carbide semiconductor device. In the SiC-MOSFET, a gate electrode 108 having a striped shape is provided in an active region 211 and a gate runner 111 that connects the gate electrode 108 to a gate electrode pad 116 is provided at an end portion (portion where the active region 211 is in contact with an edge termination region 212) of the active region 211. FIG. 16 is a top view of the active region 211 from which a source electrode (not depicted) has been removed.

FIG. 17 is a cross-sectional view of a configuration of the conventional silicon carbide semiconductor device. As depicted in FIG. 17, in the SiC-MOSFET, an n$^-$-type silicon carbide epitaxial layer 102 is deposited on a front surface of an n$^+$-type silicon carbide substrate 101, and a p-type base layer 103 and a p-type region 112 are selectively provided at a surface of the n$^-$-type silicon carbide epitaxial layer 102. Further, an n$^+$-type source region 104 and a p$^{++}$-type contact region 105 are selectively provided at a surface of the p-type base layer 103.

The gate electrode 108 having a striped shape is provided at surfaces of the p-type base layer 103 and the n$^+$-type source region 104, via a gate insulating film 106. Further, a source electrode 110 is provided at surfaces of the n$^-$-type silicon carbide epitaxial layer 102, the p$^{++}$-type contact region 105, and the n$^+$-type source region 104. A drain electrode 114 is provided at a rear surface of the n$^+$-type silicon carbide substrate 101. The p-type region 112 is a lead-out region for leading out electric charge in a horizontal direction and as depicted in FIG. 16, is provided at an end portion of the active region 211, i.e., an end portion that is parallel to the gate electrode 108.

Further, the p-type region 112 is a lead-out region for leading out electric charge in a horizontal direction and as depicted in FIG. 16, is provided at an end portion of the active region 211, i.e., an end portion that is parallel to the gate electrode 108. An insulating film 107, an interlayer insulating film 109, and the gate runner 111 are provided at a surface of the p-type region 112. The gate runner 111 is insulated from the p-type region 112 by the insulating film 107 and the interlayer insulating film 109 and is connected to the gate electrode pad 116.

A semiconductor device is commonly known in which in a SiC-MOSFET having a gate electrode of a cell structure, at a location where a shape of a border of a first well region is a concave shape, well contact holes are disposed in greater number per unit length of the border around the first well region than at a location where the shape of the border of the first well region is a straight line when viewed from above (for example, refer to Japanese Laid-Open Patent Publication No. 2011-61064). As a result, resistance between the first well region and a source pad at the location where the shape of the border of the first well region is a concave shape may be reduced, and voltage generated by the flow of displacement current during switching maybe reduced.

SUMMARY OF THE INVENTION

According to an embodiment of the invention, a silicon carbide semiconductor device having a rectangle-shaped active region in which a main current flows during an ON state of the device, and a termination region surrounding the active region in a plan view of the device, includes a silicon carbide semiconductor substrate of a first conductivity type, and having a front surface and a rear surface opposite to the front surface, a first semiconductor layer of the first conductivity type, provided on the front surface of the silicon carbide semiconductor substrate, the first semiconductor layer having an impurity concentration lower than an impurity concentration of the silicon carbide semiconductor substrate, the first semiconductor layer having a first side facing the main surface of the silicon carbide semiconductor substrate and a second side opposite to the first side, a second semiconductor layer of a second conductivity type, and being provided at a surface of the second side of the first semiconductor layer, the second semiconductor layer having a first side facing the main surface of the silicon carbide semiconductor substrate and a second side opposite to the first side, a first semiconductor region of the first conductivity type, and being selectively provided in a surface layer of the second side of the second semiconductor layer, a second semiconductor region of the second conductivity type, and being selectively provided in the surface layer of the second side of the second semiconductor layer, the second semiconductor region being disposed from a periphery of the active region to the termination region, the second semiconductor region extending along each of four sides of the active region, a gate insulating film disposed on an area of the second semiconductor layer between the first semiconductor region and the first semiconductor layer, a gate electrode having a stripe-shape, provided on the gate insulating film, a first electrode provided on the first semiconductor region and the second semiconductor layer, a second electrode provided on the rear surface of the silicon carbide semiconductor substrate, and a gate runner electrically connected to the gate electrode. At the four sides of the active region, cross-sectional structures (such as a thickness and a position) of the first and second semiconductor layers and the first and second semiconductor regions are identical to one another.

In the embodiment, the silicon carbide semiconductor device further includes a plurality of gate contact regions, each of which connects the gate electrode and the gate runner, the periphery at each of the four sides of the rectangle-shaped active region including at least one of the gate contact regions.

In the embodiment, the four sides of the rectangle-shaped active region includes two shorter sides and two longer sides, the periphery at each longer side of the rectangle-shaped active region includes a total number of the contact regions greater than a total number of the contact regions included in the periphery at each shorter side of the active region.

In the embodiment, the four sides of the rectangle-shaped active region includes shorter sides and longer sides, a total area of the contact regions included in the periphery at each longer side of the active region is greater than a total area size of the contact regions included in the periphery at each shorter side of the active region.

In the embodiment, the silicon carbide semiconductor device further includes a plurality of gate pads, each of which connects the gate runner to the gate electrode, and being disposed at the periphery of a corresponding one of the four sides of the rectangle-shaped active region.

According to another embodiment of the invention, a method of manufacturing a silicon carbide semiconductor device having a rectangle-shaped active region in which a main current flows during an ON state of the device, and a termination region surrounding the active region in a plan view of the device, the method includes forming on a front surface of a silicon carbide semiconductor substrate of a first conductivity type, a first semiconductor layer of the first conductivity type, and having an impurity concentration lower than an impurity concentration of the silicon carbide semiconductor substrate, the first semiconductor layer having a first side facing the main surface of the silicon carbide semiconductor substrate and a second side opposite to the first side, forming at a surface of the second side of the first semiconductor layer, a second semiconductor layer of a second conductivity type, the second semiconductor layer having a first side facing the main surface of the silicon carbide semiconductor substrate and a second side opposite to the first side, selectively forming in a surface layer on the second side of the second semiconductor layer, a first semiconductor region of the first conductivity type, selectively forming in the surface layer on the second side of the second semiconductor layer, a second semiconductor region of the second conductivity type to be disposed from a periphery of the active region to the termination region, the second semiconductor region extending along each of the four sides of the active region, forming a gate insulating film on an area of the second semiconductor layer between the first semiconductor region and the first semiconductor layer, forming on the gate isolating film a gate electrode having a striped shape, forming a first electrode on the first semiconductor region and the second semiconductor layer, forming a second electrode on the rear surface of the silicon carbide semiconductor substrate, and forming a gate runner that is electrically connected to the gate electrode. At the four sides of the active region, cross-sectional structures of the first and second semiconductor layers and the first and second semiconductor regions are identical to one another.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
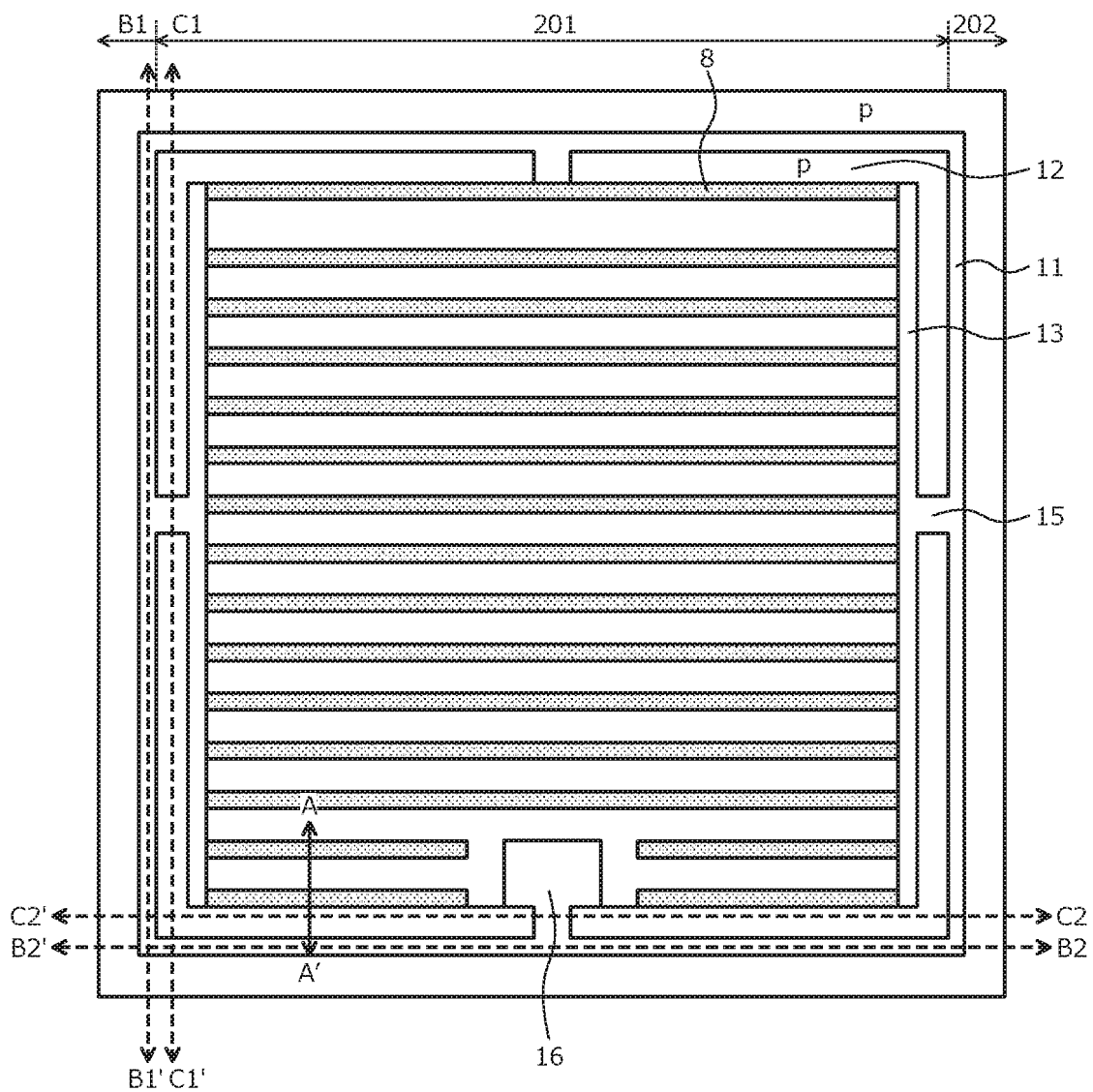
FIG. 1 is a top view of a structure of a silicon carbide semiconductor device according to an embodiment.

First, problems related to the conventional techniques will be discussed. Here, in the SiC-MOSFET, even in a high-voltage region of 1 kV or higher, low conduction loss may be obtained; further, high-speed operation of a unipolar element is possible and switching loss due to high-speed switching may be reduced, thereby enabling further reduction of loss during inverter operation.

When the SiC-MOSFET switches from an ON state to an OFF state, drain voltage, i.e., voltage of the drain electrode 114 of the SiC-MOSFET rapidly increases and in some instances, may reach around a few hundred volts (V). For example, when a 1200V SiC-MOSFET is used as an inverter, voltage of 600 to 800V is applied and current of 10 A, 20 A flows. When the SiC-MOSFET switches from the ON state to the OFF state, current that is five or ten times larger flows. Due to an increase of the drain voltage, when the OFF state is entered, displacement current is generated toward the drain electrode 114 and toward the source electrode 110 through depletion layer capacitance between the p-type base layer 103 and the n⁻-type silicon carbide epitaxial layer 102.

SiC has a critical electric field that higher than that of Si and therefore, in a 1200V SiC-MOSFET, a combined thickness of the p-type base layer 103 and the n⁻-type silicon carbide epitaxial layer 102 may be set as about one tenth of that in a Si-MOSFET. Thus, a width of a depletion layer is also reduced and as a result, variation dV/dt of drain voltage V relative to time t increases and in response to this, displacement current increases.

The displacement current generated in this manner, flows to the drain electrode 114 when generated toward the drain electrode 114, and flows through the p-type base layer 103, the p⁺⁺-type contact region 105 or the p-type region 112 to the source electrode 110 when generated toward the source electrode 110.

Here, a mathematical area of the p-type region 112 of the end portion of the active region 211 is extremely large relative to a mathematical area of the p-type base layer 103 of the active region 211 of the SiC-MOSFET and therefore, when displacement current flows in the p-type region 112, the p-type region 112, which as a large mathematical area, has resistance of a relatively large resistance value and therefore, voltage of a value that cannot be ignored is generated in the p-type region 112. As a result, at a position in the p-type region 112 a large distance in a horizontal direction from a site (contact hole) where the p-type region 112 is electrically connected to the source electrode 110 (normally connected to the earth potential), electric potential that is comparatively large is generated. This electric potential increases with increases in the displacement current and increases with increases in dV/dt.

Therefore, when the SiC-MOSFET is operated under high-voltage region operation of 1 kV or higher, for example, is operated by high-speed switching at 10V/nsec or higher, high voltage is generated in the p-type region 112 and due to high electric field caused by this high voltage, the gate insulating film 106 may be destroyed.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 2:
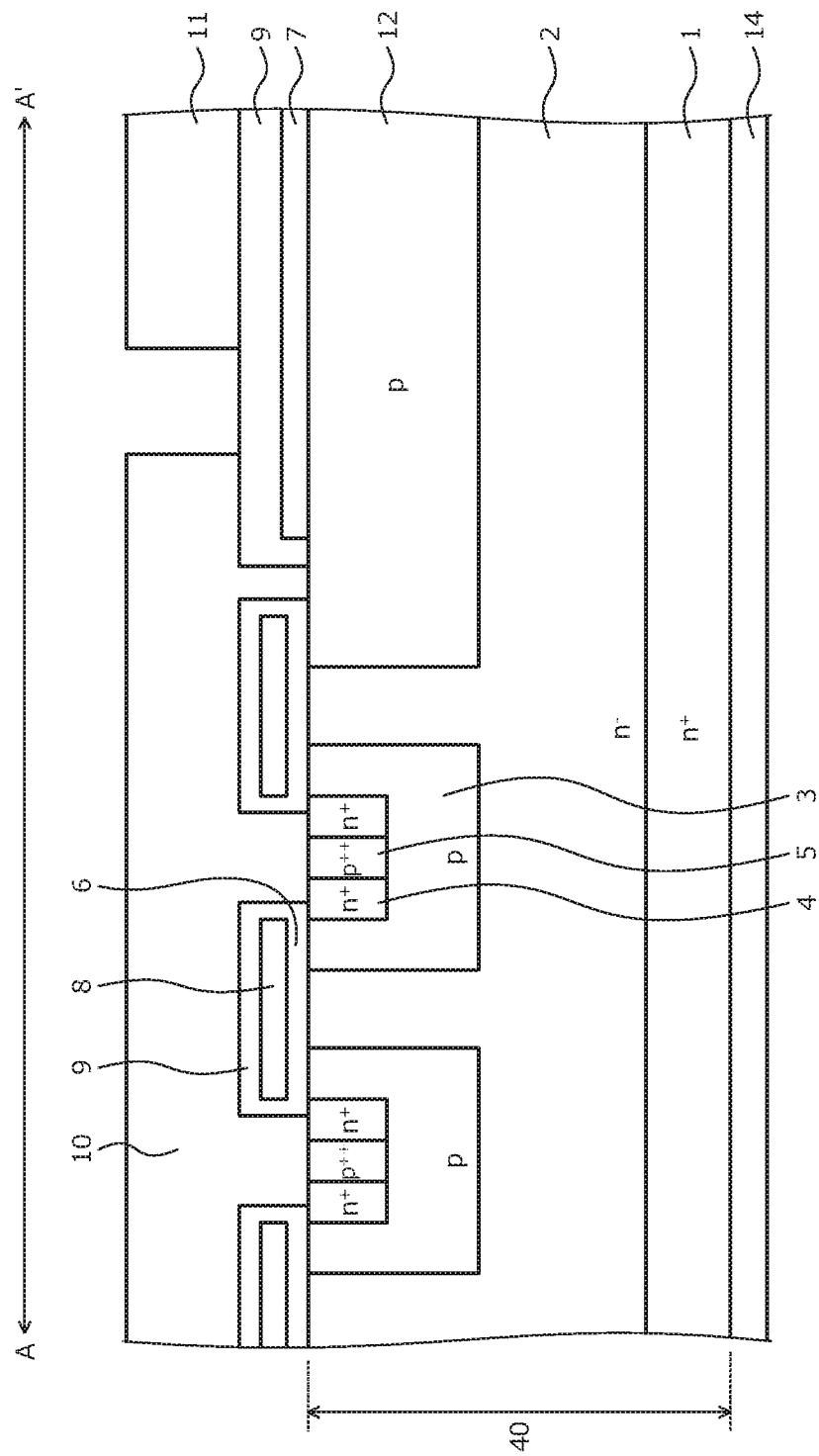
FIG. 2 is a cross-sectional view of a portion of the structure of the silicon carbide semiconductor device according to the embodiment, along cutting line A-A' depicted in FIG. 1.

A semiconductor device according to the present invention is configured using a wide bandgap semiconductor material. In an embodiment, a silicon carbide semiconductor device fabricated using, for example, silicon carbide (SiC) as the wide bandgap semiconductor material, will be described taking a MOSFET as an example. FIG. 1 is a top view of a structure of the silicon carbide semiconductor device according to the embodiment. FIG. 2 is a cross-sectional view of a portion of the structure of the silicon carbide semiconductor device according to the embodiment, along cutting line A-A' depicted in FIG. 1.

As depicted in FIGS. 1 and 2, the silicon carbide semiconductor device according to the embodiment includes in a semiconductor base (hereinafter, silicon carbide semiconductor base (semiconductor substrate (semiconductor chip))) 40 containing silicon carbide, an active region 201 and an edge termination region 202 that surrounds a periphery of the active region 201. The active region 201 is a region through which current flows in an ON state. The edge termination region 202 is a region that mitigates electric field at a base front surface side of a drift region and sustains breakdown voltage. FIG. 1 is a top view in which a later described source electrode 10 of the active region 201 has been removed.

At a front side of the silicon carbide semiconductor base 40, a MOS (insulated gate configured by a metal, an oxide film, a semiconductor material) structure (element structure) is formed. In particular, an n⁻-type silicon carbide epitaxial layer (first semiconductor layer of a first conductivity type) 2 containing silicon carbide is stacked on a front surface of an n⁺-type silicon carbide substrate (silicon carbide semiconductor substrate of the first conductivity type) 1 containing silicon carbide. In the active region 201, in a surface layer on a second side (base front surface side) of the n⁻-type silicon carbide epitaxial layer 2, opposite a first side of the n⁻-type silicon carbide epitaxial layer 2 facing toward the n⁺-type silicon carbide substrate 1, a p-type base layer (second semiconductor layer of a second conductivity type) 3 and a p-type region (second semiconductor region of the second conductivity type) 12 that extends to the edge termination region 202 are selectively provided.

An n⁺-type source region (first semiconductor region of the first conductivity type) 4 and a p⁺⁺-type contact region 5 are provided at a surface of the p-type base layer 3. Further, the n⁺-type source region 4 and the p⁺⁺-type contact region 5 are in contact with each other. The n⁺-type source region 4 is disposed in a periphery of the p⁺⁺-type contact region 5.

Further, at a surface of portions of the p-type base layer 3 between the n⁺-type source region 4 and the n⁻-type silicon carbide epitaxial layer 2, gate electrodes 8 are provided via a gate insulating film 6. The gate electrodes 8 may be provided at a surface of the n⁻-type silicon carbide epitaxial layer 2 via the gate insulating film 6.

An interlayer insulating film 9 is provided at the front side of the silicon carbide semiconductor base 40 overall so as to cover the gate electrodes 8. A source electrode (first electrode) 10 is in contact with the n⁺-type source region 4 and the p⁺⁺-type contact region 5 via a contact hole opened in the interlayer insulating film 9. The source electrode 10 is electrically insulated from the gate electrodes 8 by the interlayer insulating film 9. On the source electrode 10, an electrode pad (not depicted) is provided.

Further, at a surface of the p-type region 12 at an end portion (A' side in FIG. 2) of the active region 201, a gate runner 11 is provided that is insulated from the p-type region 12 by an insulating film 7 and the interlayer insulating film 9. The gate runner 11 may be metal wiring or wiring having poly-silicon. Further, the gate runner 11 is electrically connected to a gate electrode pad 16 and is electrically connected to the gate electrodes 8 via a contact hole opened in the interlayer insulating film 9 at an end portion of the gate electrodes 8.

Figure 16:
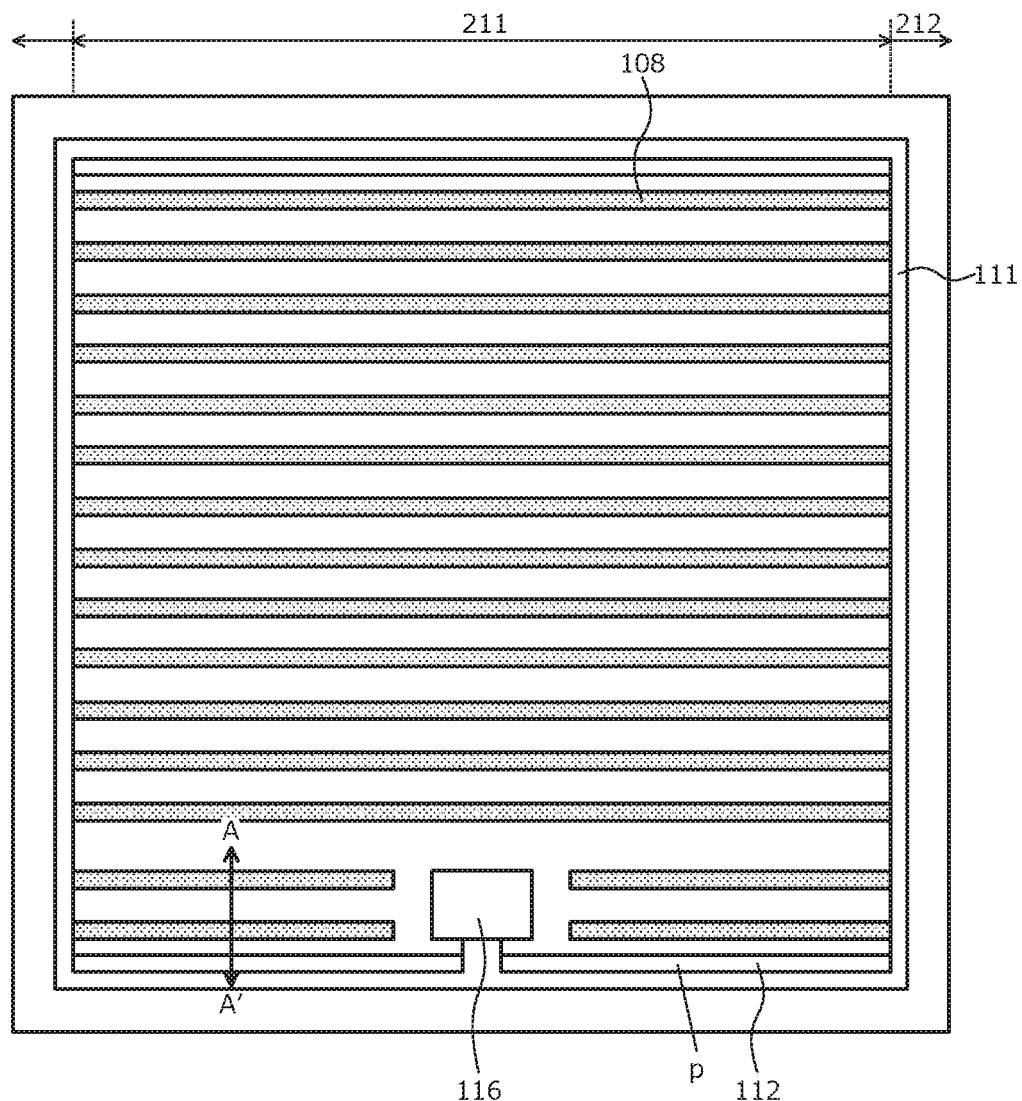
FIG. 16 is a top view of a structure of a conventional silicon carbide semiconductor device.
Figure 17:
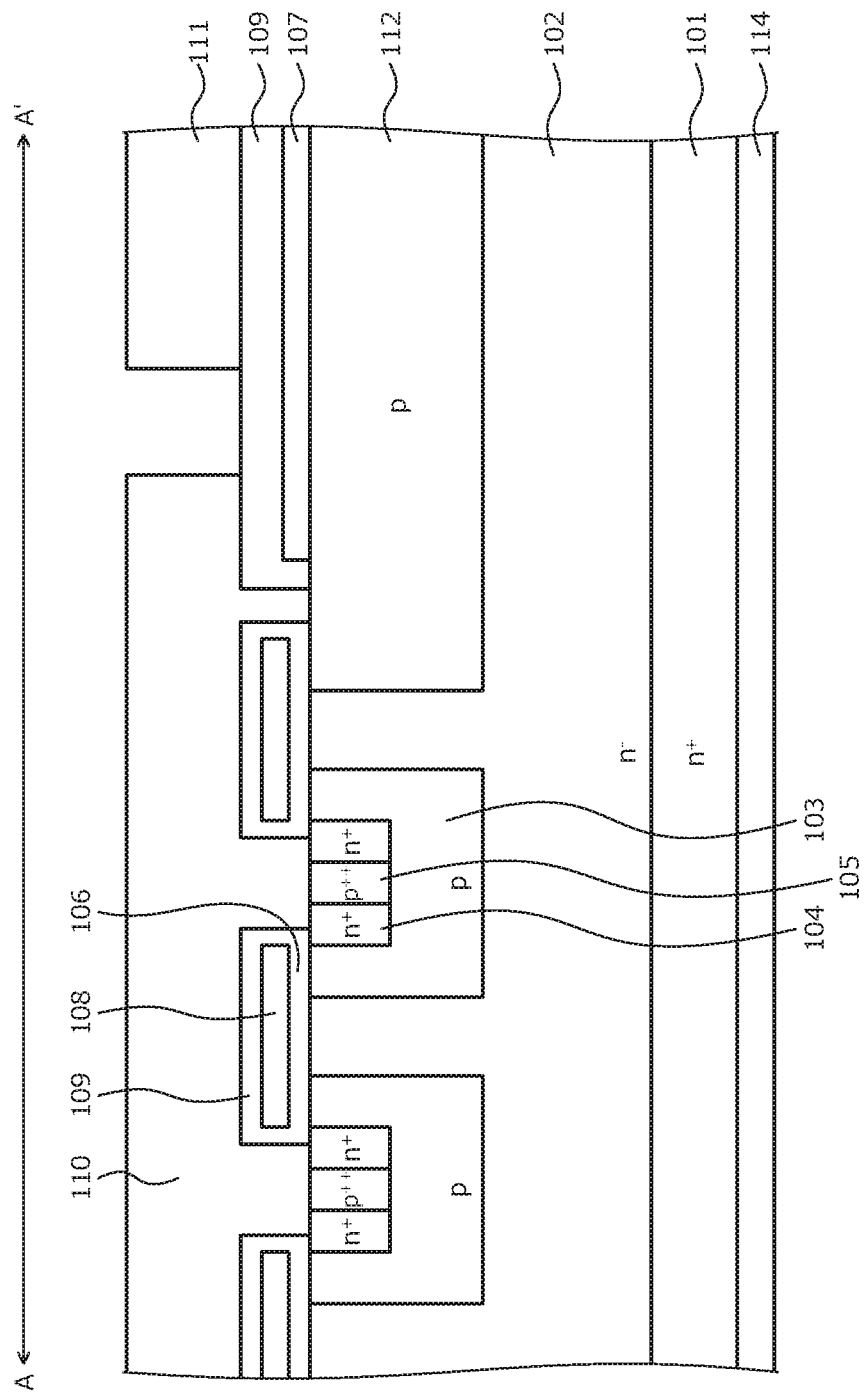
FIG. 17 is a cross-sectional view of a configuration of the conventional silicon carbide semiconductor device.

As depicted in FIG. 1, the active region 201 and the edge termination region 202 have surfaces forming a rectangular shape. In the conventional structure of the silicon carbide semiconductor device, the p-type region 112 is provided at an end portion of the active region 201 that is parallel to the gate electrode 108 (refer to FIG. 16). In contrast, in the silicon carbide semiconductor device of the embodiment, the p-type region 12 extends in directions parallel to four sides of the rectangular shape; and the p-type region 12 is provided at an end portion of the active region 201 parallel to the gate electrodes 8 and at an end portion of the active region 201 orthogonal to the gate electrodes 8. Thus, a cross-sectional shape of an end portion of the active region 201 is similar on all four sides.

Figure 3:
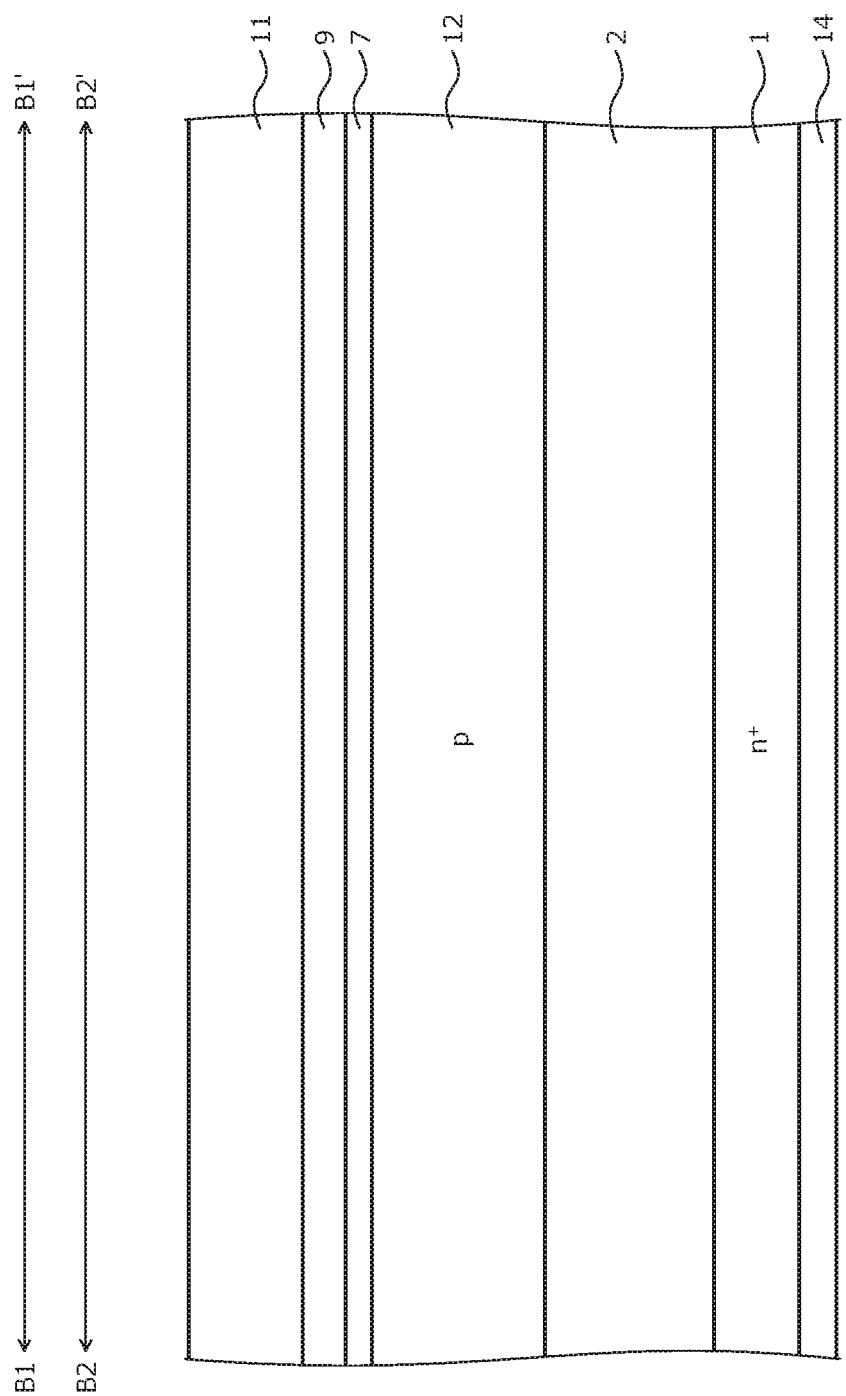
FIG. 3 is a cross-sectional view of portions of the structure of the silicon carbide semiconductor device according to the embodiment, along cutting lines B1-B1' and B2-B2' depicted in FIG. 1.
Figure 4:
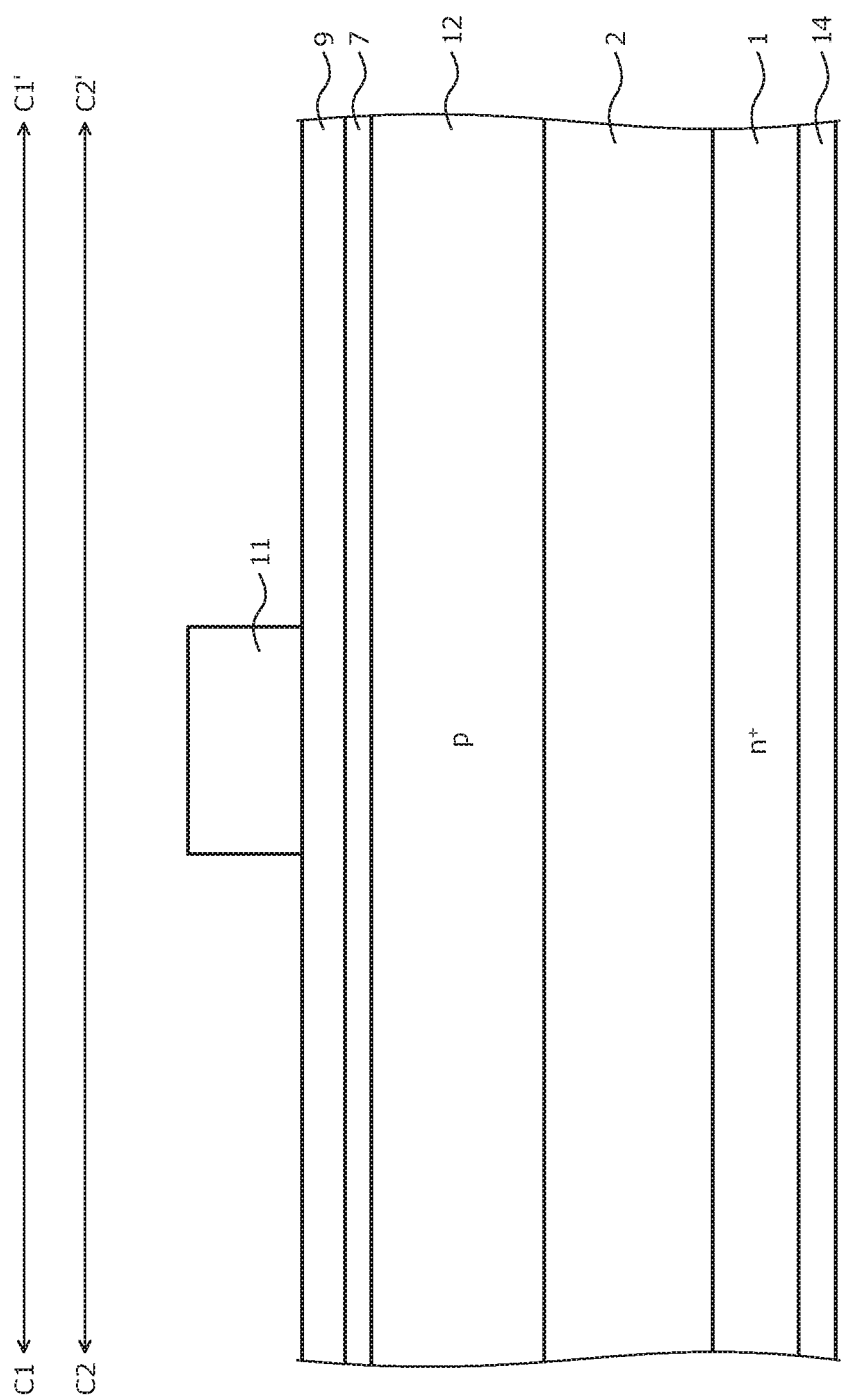
FIG. 4 is a cross-sectional view of portions of the structure of the silicon carbide semiconductor device according to the embodiment, along cutting lines C1-C1' and C2-C2' depicted in FIG. 1.

FIG. 3 is a cross-sectional view of portions of the structure of the silicon carbide semiconductor device according to the embodiment, along cutting lines B1-B1' and B2-B2' depicted in FIG. 1. FIG. 4 is a cross-sectional view of portions of the structure of the silicon carbide semiconductor device according to the embodiment, along cutting lines C1-C1' and C2-C2' depicted in FIG. 1. As depicted in FIGS. 3 and 4, cross-sectional shapes of an end portion of the active region 201, along an x axis direction have cross-sectional shapes similar to those of an end portion of the active region 201 along a y axis direction.

In this manner, the p-type region 12 extends in directions parallel to the four sides, whereby the p-type region 12, which has an electric charge extraction function, may evenly distribute avalanche current in directions parallel to the four sides even when a large variation in voltage occurs, unusual electric field, high-speed electric field is applied to the edge termination region 202, or large avalanche current is generated in the edge termination region 202. As a result, when avalanche current is generated, generated carriers may be lead out without electric field further concentrating in the edge termination region 202 and increasing. Therefore, an action of sustaining the breakdown voltage of the edge termination region 202 is achieved, destruction becomes less likely to occur, and breakdown capability of the edge termination region is improved. In particular, by the p-type region 12 extending in directions parallel to the four sides, the breakdown capability of the edge termination region is at least 2 times that in the conventional structure.

Further, as depicted in FIG. 1, the gate electrodes 8 have a striped shape. While the gate electrodes 8 are connected to the gate electrode pad 16 via the gate runner 11, in the embodiment, the p-type region 12 may be further provided at an end portion of the striped shape of the gate electrodes 8. Therefore, a second gate runner 13 is provided at an inner side (toward the active region 201) of the p-type region 12 and the gate electrodes 8 is connected to the gate electrode pad 16 via the second gate runner 13. The second gate runner 13 is connected to the gate runner 11 via a gate contact region 15.

Further, the gate contact region 15 is provided at all four sides of the rectangular shape. Such configuration enables differences in a distance between the gate electrode pad 16 and each of the gate electrodes 8 to be reduced, thereby enabling delays in current flowing to the gate electrodes 8 to be reduced.

In the silicon carbide semiconductor device according to the embodiment, the n⁺-type silicon carbide substrate 1 forms a drain region and at a surface (rear surface of the silicon carbide semiconductor base 40) thereof on a first side of the n⁺-type silicon carbide substrate 1, opposite a second side of the n⁺-type silicon carbide substrate 1 facing toward the n⁻-type silicon carbide epitaxial layer 2, a drain electrode (second electrode) 14 is provided. Further, a drain electrode pad (not depicted) for connection to an external device is provided.

In FIG. 2, while only two MOS structures are depicted, plural MOS structures may be disposed in parallel.

Figure 5:
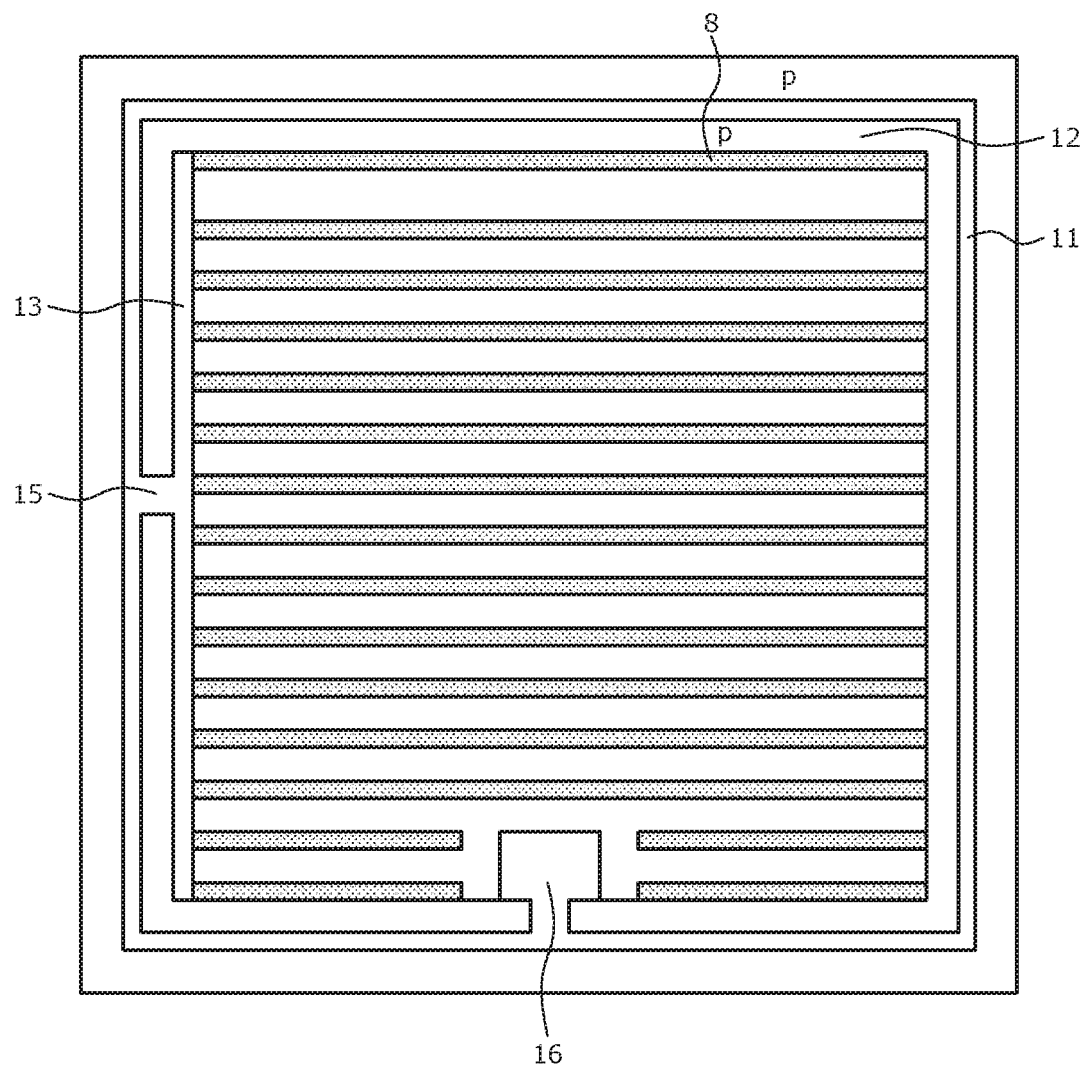
FIG. 5 is a top view of another structure of the silicon carbide semiconductor device according to the embodiment.
Figure 6:
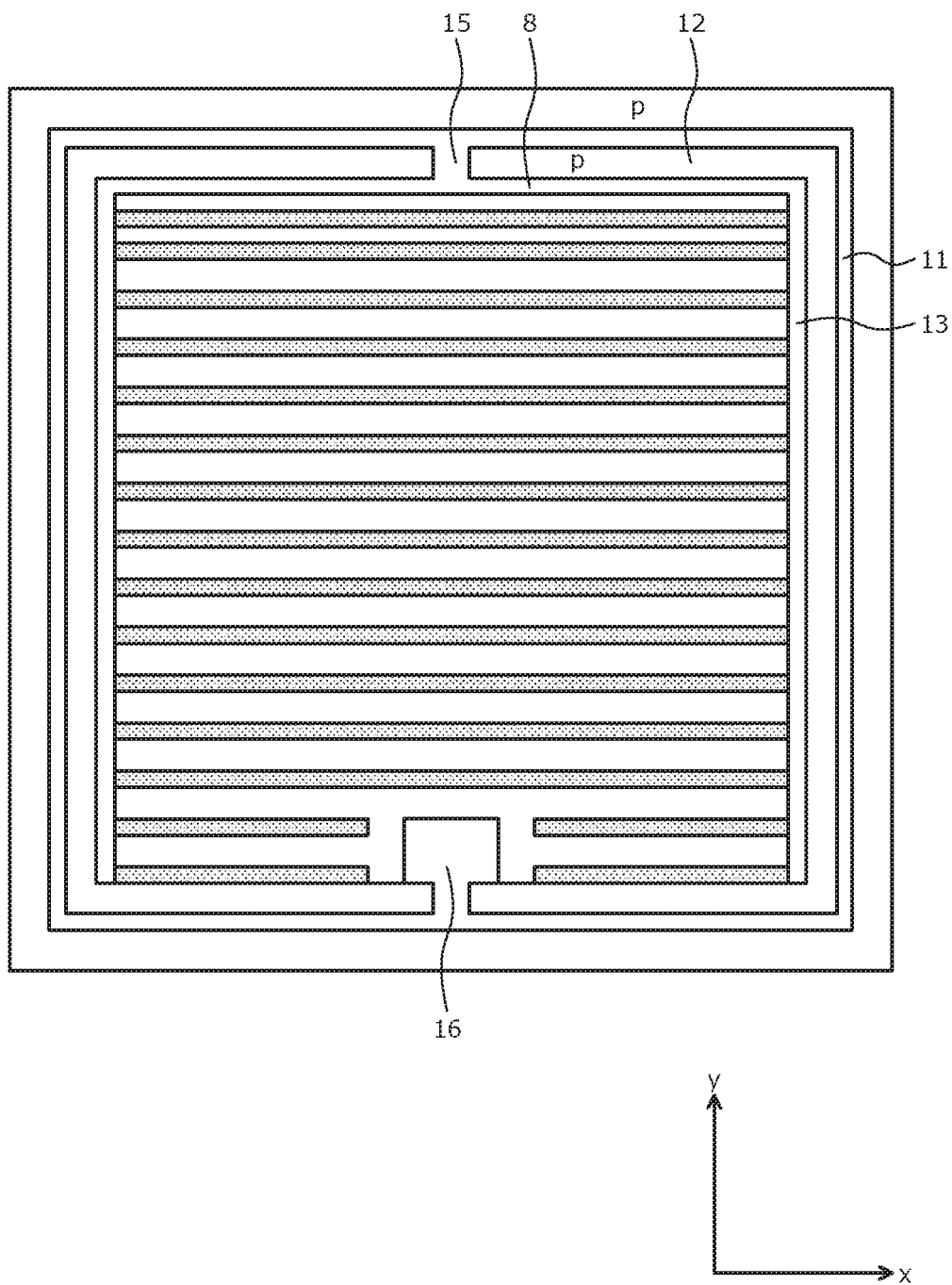
FIG. 6 is a top view of another structure of the silicon carbide semiconductor device according to the embodiment.

FIGS. 5, 6, 7, 8, 9, and 10 are top views of other structures of the silicon carbide semiconductor device according to the embodiment. In the structures depicted in FIGS. 5 and 6, the gate contact region 15 is provided only on two of the four sides of the rectangular shape of the active region 201. In this case, as depicted in FIG. 5, the gate contact region 15 may be disposed on a side along the x axis direction and a side along the y axis direction of the rectangular shape, or as depicted in FIG. 6, may be disposed on opposing sides of the rectangular shape (in FIG. 6, sides along the x axis). In the structures depicted in FIGS. 5 and 6, the gate contact region 15 is reduced in number, thereby enabling sessions of a process of forming the gate contact region 15 to be omitted. Further, in FIGS. 5 and 6, while the gate contact region 15 is disposed only at two sides, the structure may be such that the gate contact region 15 is provided at three of the four sides of the rectangular shape of the active region 201.

Figure 7:
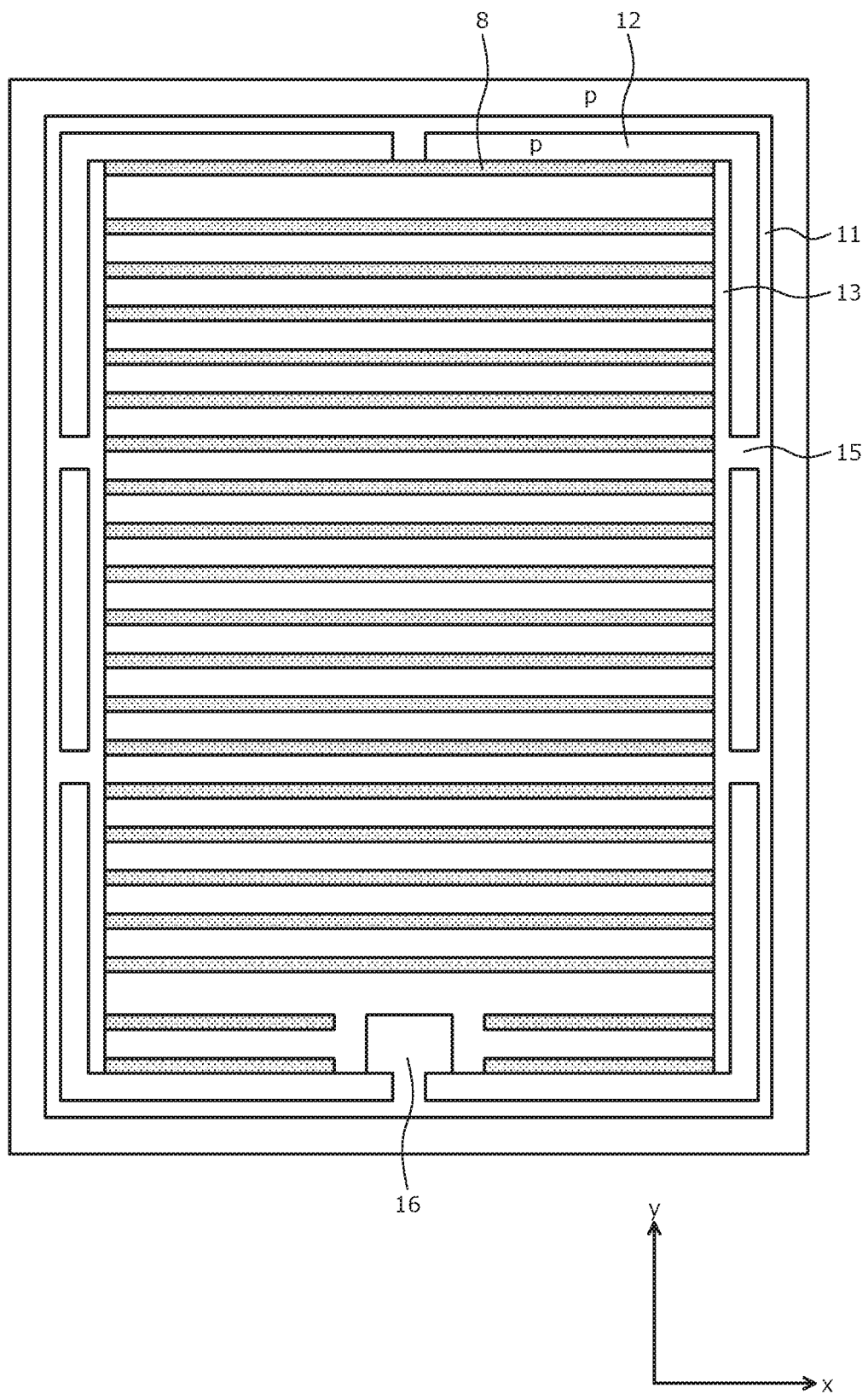
FIG. 7 is a top view of another structure of the silicon carbide semiconductor device according to the embodiment.
Figure 8:
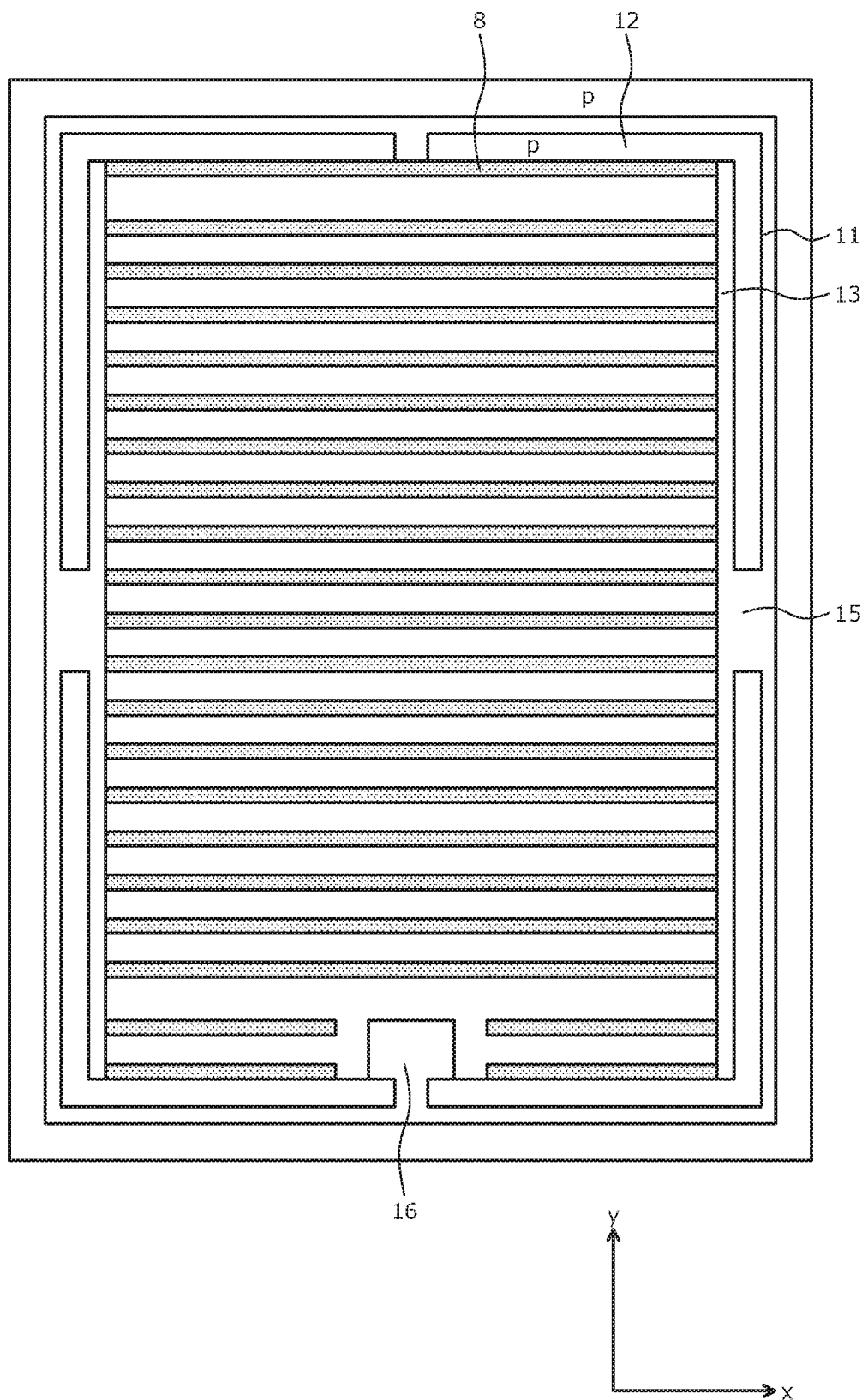
FIG. 8 is a top view of another structure of the silicon carbide semiconductor device according to the embodiment.

FIGS. 7 and 8 are examples in a case in which the active region 201 has a rectangular shape. In FIGS. 7 and 8, an example is depicted in which sides along the y axis direction are longer than sides along the x axis direction. In such a structure, on the long sides along the y axis direction, the gate contact region 15 is provided in greater number than on the short sides along the x axis direction. Alternatively, the gate contact region 15 on the long side along the y axis direction may have a mathematical area that is larger than a mathematical area of the gate contact region 15 on the short side along the x axis direction.

In the example depicted in FIG. 7, on each of the sides along the y axis direction, two of the gate contact regions 15 are provided while on each of the sides along the x axis direction one of the gate contact regions 15 is provided. By such a structure, even when the sides along the y axis direction are longer, the distances between the gate contact region 15 and the gate electrodes 8 are prevented from increasing, thereby enabling a structure in which delays of the current flowing to the gate electrodes 8 do not occur. FIG. 7 depicts one example, and more than two of the gate contact regions 15 may be on the sides along the y axis direction and more than one of the gate contact regions 15 may be on the sides along the x axis direction.

Further, in the example depicted in FIG. 8, on the sides along they axis direction, the gate contact region 15 is provided having a mathematical area that is larger than that of the gate contact region 15 on the sides along the x axis direction. By such a structure, even when the sides along the y axis direction are longer, current of the gate electrodes 8 may be prevented from concentrating at the gate contact regions 15 that are relatively narrow and electric field may be prevented from increasing.

The structures depicted in FIGS. 7 and 8 may be combined. In other words, on the long sides along the y axis direction, the gate contact region 15 is provided in greater number than on the short sides along the x axis direction and the mathematical area of the gate contact region 15 provided on the sides along the y axis direction is larger than the mathematical area of the gate contact region 15 provided on the sides along the x axis direction. In this case, the mathematical areas of all of the gate contact regions 15 provided on the sides along the y axis direction need not be increased.

In the examples depicted in FIGS. 7 and 8, while the gate electrodes 8 are provided parallel to the short sides along the x axis direction, the structure may be such that the gate electrodes 8 are provided parallel to the long sides along the y axis direction. In this case as well, regarding the number of and the mathematical areas of the gate contact regions 15, similarly to the instances depicted in FIGS. 7 and 8, the number and the mathematical area may be greater on the long sides along the y axis direction.

Figure 9:
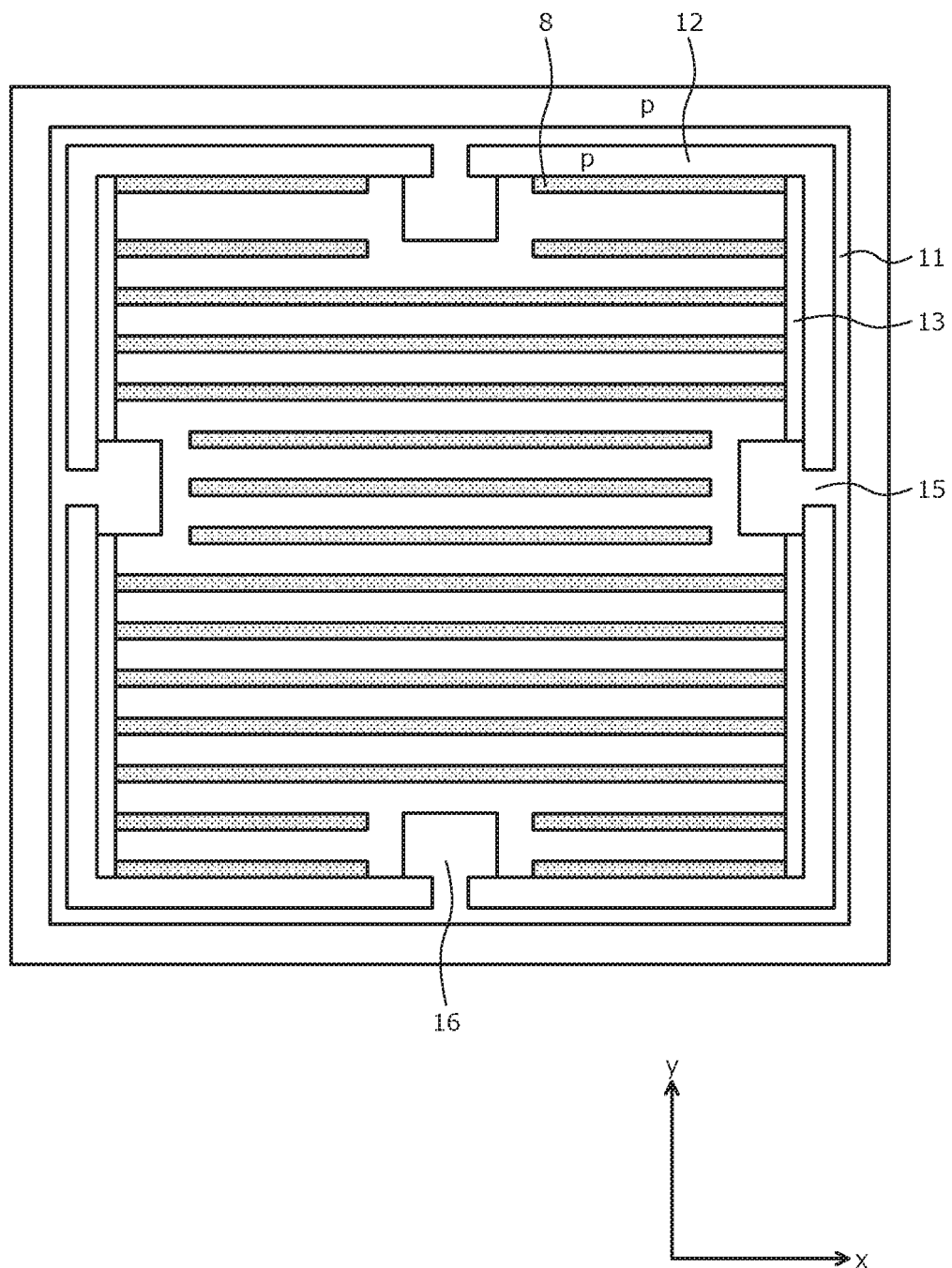
FIG. 9 is a top view of another structure of the silicon carbide semiconductor device according to the embodiment.

An example depicted in FIG. 9 is an example in which the gate electrode pad 16 is provided at each side of the rectangular shape of the active region 201. The gate electrode pad 16 is provided, whereby distances between the gate electrode pad 16 and the gate electrodes 8 are prevented from increasing, thereby enabling structure in which delays of current flowing to the gate electrodes 8 do not occur. When long sides are present as depicted in FIGS. 7 and 8, the gate electrode pad 16 may be provided in greater number on the long sides or the mathematical area of the gate electrode pad 16 may be increased. In this case as well, the distances between the gate electrode pad 16 and the gate electrodes 8 may be prevented from increasing.

Figure 10:
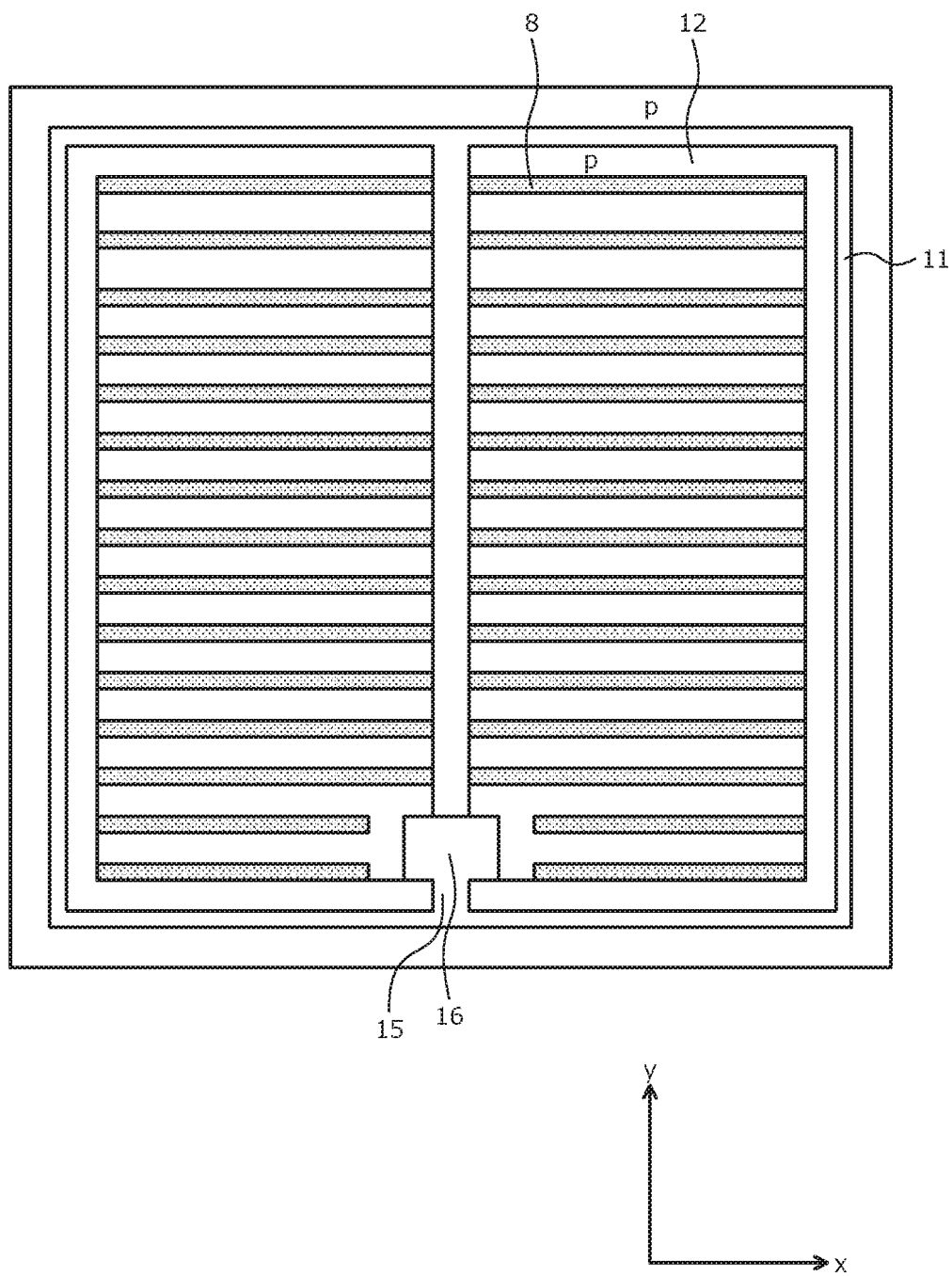
FIG. 10 is a top view of another structure of the silicon carbide semiconductor device according to the embodiment.

An example depicted in FIG. 10 is an example in which the gate runner 11 is provided at a center of the active region 201. In this manner, a configuration in which the gate runner 11 and the source electrodes 10 are connected by a center portion without provision of the gate contact region 15 at each of the sides is possible.

A method of manufacturing a silicon carbide semiconductor device according to the embodiment will be described. FIGS. 11, 12, 13, and 14 are cross-sectional views of the silicon carbide semiconductor device according to the embodiment during manufacture.

Figure 11:
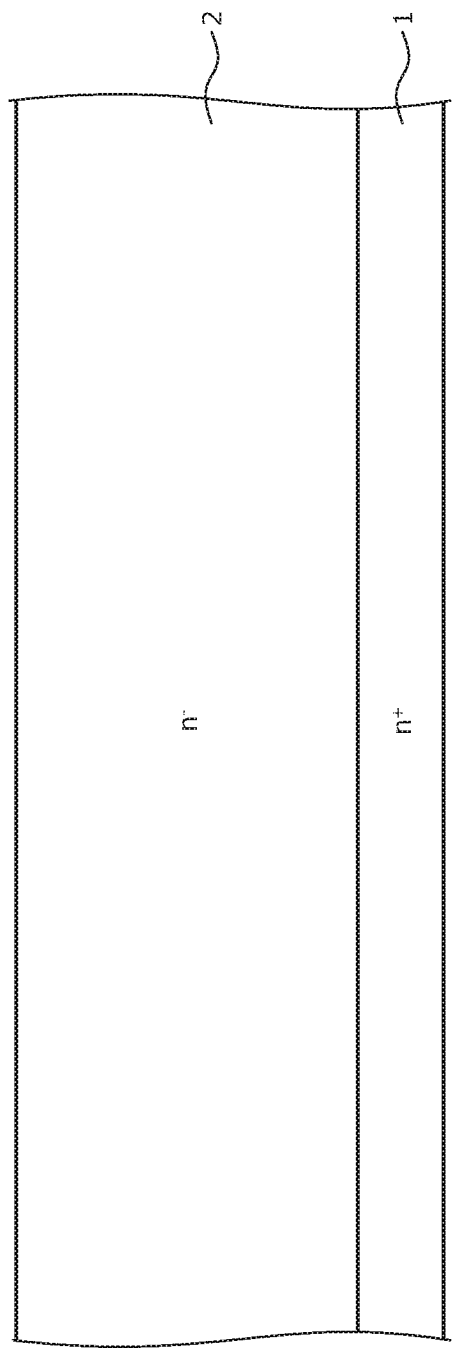
FIG. 11 is a cross-sectional view of the silicon carbide semiconductor device according to the embodiment during manufacture.

First, the $n^+$-type silicon carbide substrate 1 doped with nitrogen ($N_2$) to have an impurity concentration of, for example, about $2 \times 10^{19}/cm^3$ is prepared. The $n^+$-type silicon carbide substrate 1 may have a main surface that, for example, is a (000-1) plane having about a 4-degree off-angle in a crystal axis direction <11-20>. Next, on the (000-1)-plane of the $n^+$-type silicon carbide substrate 1, the $n^-$-type silicon carbide epitaxial layer 2 doped with nitrogen to have an impurity concentration of $1.0 \times 10^{16}/cm^3$ is formed having a thickness of about 10 µm. The structure formed up to here is depicted in FIG. 11.

Figure 12:
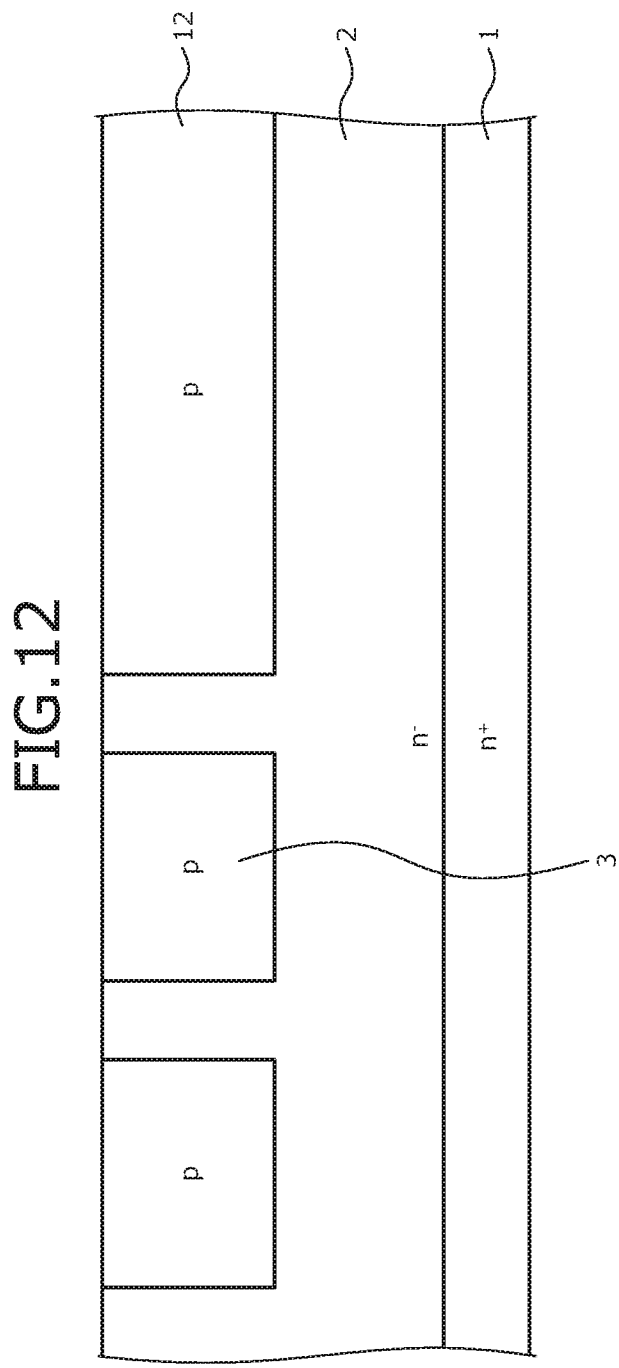
FIG. 12 is a cross-sectional view of the silicon carbide semiconductor device according to the embodiment during manufacture.

Next, an oxide film mask for ion implantation is formed by photolithography and etching, and the p-type base layer 3 and the p-type region 12 are selectively formed in a surface layer of the $n^-$-type silicon carbide epitaxial layer 2 by ion implantation. In this ion implantation, for example, a dopant is aluminum (Al) and a dose amount may be set so that an impurity concentration of the p-type base layer 3 and the p-type region 12 is in a range from $1 \times 10^{16}$ to $1 \times 10^{18}/cm^3$. From the active region 201, the p-type region 12 extends in directions of the four sides, to the edge termination region 202. The structure up to here is depicted in FIG. 12.

Figure 13:
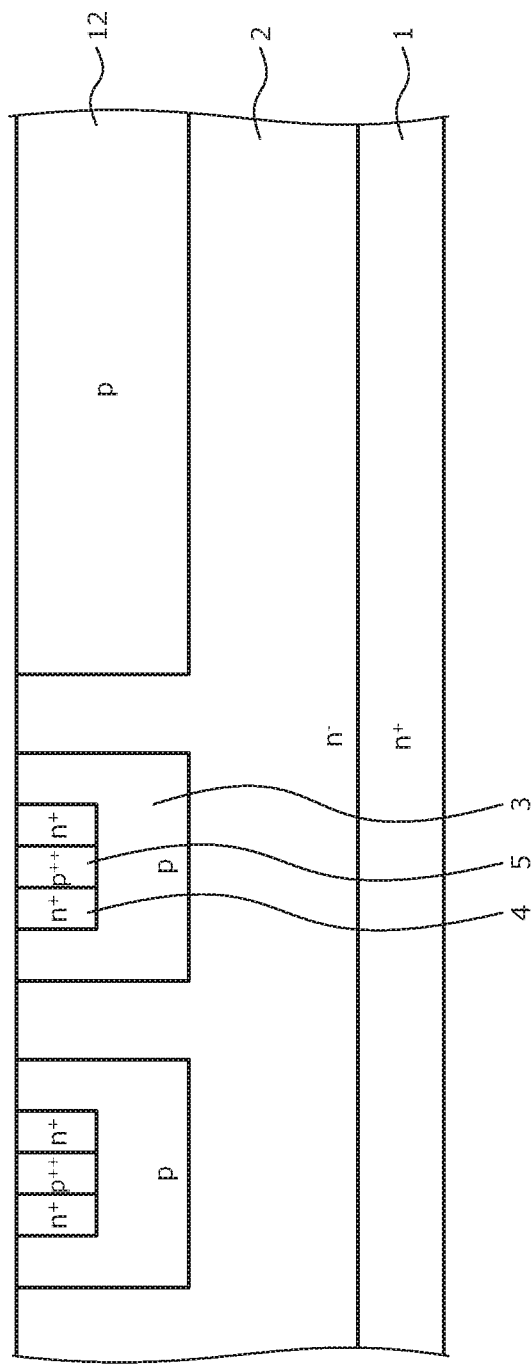
FIG. 13 is a cross-sectional view of the silicon carbide semiconductor device according to the embodiment during manufacture.

Next, the $n^+$-type source region 4 is selectively formed in a surface layer of the p-type base layers 3 by photolithography and ion implantation. Next, the $p^{++}$-type contact region 5 is selectively formed in the surface layer of the p-type base layers 3 by photolithography and ion implantation. For example, a dopant is aluminum and a dose amount is set so that an impurity concentration of the $p^{++}$-type contact region 5 is in a range from $1 \times 10^{17}$ to $1 \times 10^{19}/cm^3$. The structure up to here is depicted in FIG. 13.

A sequence in which the $n^+$-type source region 4 and the $p^{++}$-type contact region 5 are formed may be variously changed.

Next, a heat treatment (annealing) for activating the p-type base layers 3, the $n^+$-type source regions 4, the $p^{++}$-type contact regions 5, and the p-type region 12 is performed. A temperature and period of the heat treatment may be 1620 degrees C. and 2 minutes, respectively. As described above, ion implanted regions may be collectively activated by one session of the heat treatment or the heat treatment and activation may be performed each time ion implantation is performed.

Next, the front side of the silicon carbide semiconductor base 40 is thermally oxidized, thereby forming an oxide film that forms the gate insulating film 6 and the insulating film 7. Here, thermal oxidation may be performed by a heat treatment at a temperature of about 1000 degrees C. in a mixed atmosphere containing oxygen ($O_2$) and hydrogen ($H_2$). As a result, regions formed at surfaces of the p-type base layers 3 and the n⁻-type silicon carbide epitaxial layer 2 are covered by the insulating film 7 and the gate insulating film 6.

Next, on the gate insulating film 6, a polycrystalline silicon layer (poly-silicon (poly-Si) layer) doped with, for example, phosphorus (P) is formed as the gate electrodes 8. Next, the polycrystalline silicon layer is patterned and selectively removed to leave the polycrystalline silicon layer on portions of the p-type base layers 3, the portions between the n⁻-type silicon carbide epitaxial layer 2 and the n⁺-type source regions 4. At this time, the polycrystalline silicon layer may be left on the n⁻-type silicon carbide epitaxial layer 2.

Figure 14:
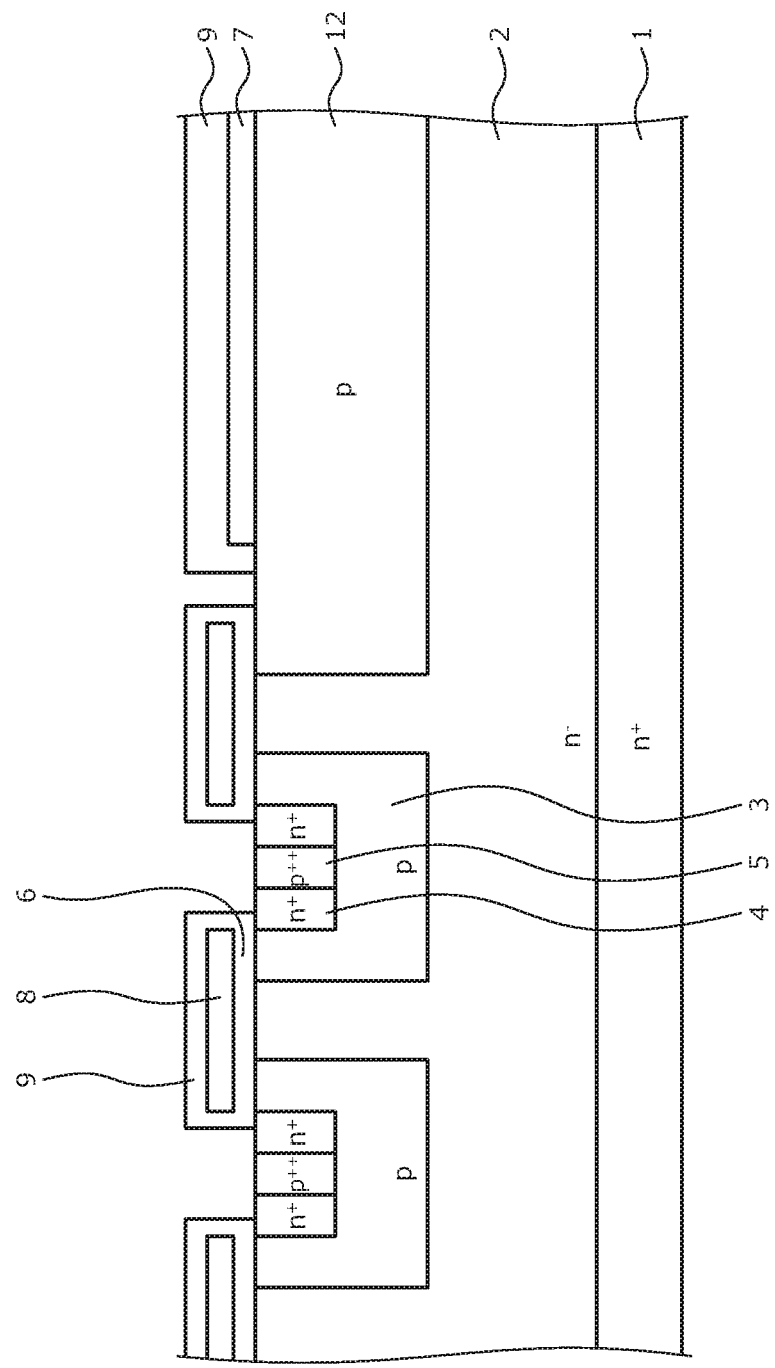
FIG. 14 is a cross-sectional view of the silicon carbide semiconductor device according to the embodiment during manufacture.

Next, for example, phosphosilicate glass (PSG) is deposited as the interlayer insulating film 9 so as to cover the gate insulating film 6 and the insulating film 7. The interlayer insulating film 9 may have a thickness of 1.0 µm. Next, the interlayer insulating film 9, the gate insulating film 6, and the insulating film 7 are patterned and selectively removed, thereby forming a contact hole and exposing the n⁺-type source region 4 and the p⁺⁺-type contact region 5. Next, a heat treatment (reflow) for planarizing the interlayer insulating film 9 is performed. The structure up to here is depicted in FIG. 14.

Next, at a surface of the interlayer insulating film 9 on the gate electrodes 8, the source electrode 10 is formed. Here, the source electrode 10 is further embedded in each contact hole, thereby bringing the n⁺-type source region 4 and the p⁺⁺-type contact region 5 in contact with the source electrode 10. Next, the source electrode 10 is selectively removed excluding that of the contact holes. Next, the gate runner 11 is deposited and patterned.

Next, at a surface (rear surface of the silicon carbide semiconductor base 40) of the n⁺-type silicon carbide substrate 1, for example, a nickel film is deposited as the drain electrode 14. Subsequently, for example, a heat treatment at a temperature of 970 degrees C. is performed, thereby forming an ohmic junction between the n⁺-type silicon carbide substrate 1 and the drain electrode 14. Next, an electrode pad that forms the gate electrode pad (not depicted) and a source electrode pad is deposited at a front surface of the silicon carbide semiconductor base 40 overall, for example, by a sputtering method, so as to cover the source electrode 10 and the interlayer insulating film 9. A thickness of a portion of the electrode pad on the interlayer insulating film 9 may be, for example, 5 µm. The electrode pad, for example, may be formed of aluminum that contains silicon at a ratio of 1% (Al—Si). Next, the electrode pad is selectively removed.

Next, at a surface of the drain electrode 14, for example, titanium (Ti), nickel (Ni), and gold (Au) are sequentially deposited as the drain electrode pad. Next, a protective film may be formed at a surface. Thus, silicon carbide semiconductor device depicted in FIGS. 1 and 2 is completed.

Figure 15:
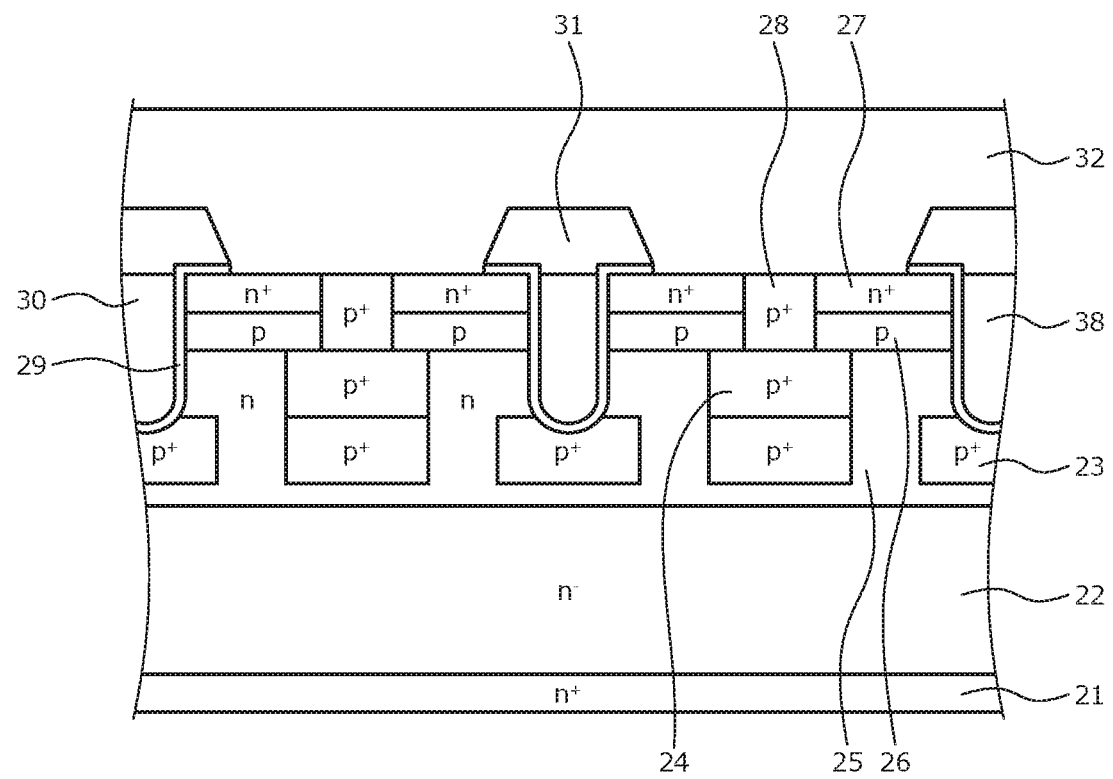
FIG. 15 is a cross-sectional view of a structure of a trench-type silicon carbide MOSFET according to the embodiment.

In the embodiment, while description is given taking a planar-type silicon carbide MOSFET as an example, the present invention is further applicable to a trench-type silicon carbide MOSFET. FIG. 15 is a cross-sectional view of a structure of a trench-type silicon carbide MOSFET according to the embodiment.

In FIG. 15, reference numerals 21, 22, 23, 24, 25, 26, 27, 28, 29, 30, 31, 32, and 38 are the n⁺-type silicon carbide substrate, an n⁻-type drift layer, a first p⁺-type region, a second p⁺-type region, an n-type region, a p-type base layer, an n⁺-type source region, a p⁺-type contact region, a gate insulating film, a gate electrode, an interlayer insulating film, a source electrode, and a trench, respectively. In a vertical MOSFET having such a trench gate structure, the gate electrode 30 is provided in a striped shape.

Further, a top view of the trench-type silicon carbide MOSFET is similar to that of the planar-type silicon carbide MOSFET and therefore, is not depicted in the figures. In this type of trench-type silicon carbide MOSFET as well, the second p⁺-type region 24 at an end portion of the active region extends in directions parallel to the four sides, whereby effects similar to those of the planar-type silicon carbide MOSFET are obtained.

As described, according to the silicon carbide semiconductor device of the embodiment, the p-type region extends in directions parallel to the four sides of the rectangular shape of the active region and a cross-sectional shape of an end portion of the active region has a cross-sectional shape that is similar on all four sides. As a result, even when avalanche current is generated, the avalanche current may be evenly distributed in directions parallel to the four sides and thus, electric field does not concentrate or become high. Therefore, an action of sustaining the breakdown voltage of the edge termination region is achieved, destruction becomes less likely to occur, and the breakdown capability of the edge termination region is improved.

While an instance in which a main surface of a silicon carbide substrate containing silicon carbide is a (0001)-plane and at the (0001)-plane, a MOS is configured is described as an example, the present invention is not limited hereto and various modifications such as in the wide bandgap semiconductor material, surface orientation of the main surface of the substrate, etc. are possible.

Further, in the embodiments of the present invention, while a planar-type and a trench-type MOSFET are described as an example, without limitation hereto, application is possible to semiconductor devices having various types of configurations including a MOS-type semiconductor device such as an IGBT that has a gate electrode having a striped shape. Further, in the embodiments, while a case in which silicon carbide is used as a wide bandgap semiconductor material is described as an example, similar effects are obtained when a wide bandgap semiconductor material other than silicon carbide is used such as gallium nitride (GaN). In the embodiments, while the first conductivity type is an n-type and the second conductivity type is a p-type, the present invention is similarly implemented when the first conductivity type is a p-type and the second conductivity type is an n-type.

According to the present invention, the p-type region (second semiconductor region of the second conductivity type) extends in directions parallel to the four sides of the rectangular shape of the active region, and the cross-sectional shape of an end portion of the active region is similar on all four sides. As a result, even when avalanche current is generated, the avalanche current may be evenly distributed in directions parallel to the four sides and thus, electric field does not concentrate or become high. Therefore, an action of sustaining the breakdown voltage of the edge termination region is achieved, destruction becomes less likely to occur, and the breakdown capability of the edge termination region is improved.

The silicon carbide semiconductor device and the method of manufacturing a silicon carbide semiconductor device according to the present invention achieve an effect in that the breakdown capability of the edge termination region when large voltage variation occurs is improved.

As described, the silicon carbide semiconductor device and the method of manufacturing a silicon carbide semiconductor device according to the present invention are useful for high-voltage semiconductor devices used in power converting equipment and in various power supply devices such as in industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having a rectangle-shaped active region in which a main current flows during an ON state of the device, and a termination region surrounding the active region in a plan view of the device, comprising:
    a silicon carbide semiconductor substrate of a first conductivity type, and having a front surface and a rear surface opposite to the front surface;
    a first semiconductor layer of the first conductivity type, provided on the front surface of the silicon carbide semiconductor substrate, the first semiconductor layer having an impurity concentration lower than an impurity concentration of the silicon carbide semiconductor substrate, the first semiconductor layer having a first side facing the main surface of the silicon carbide semiconductor substrate and a second side opposite to the first side;
    a second semiconductor layer of a second conductivity type, and being provided at a surface of the second side of the first semiconductor layer, the second semiconductor layer having a first side facing the main surface of the silicon carbide semiconductor substrate and a second side opposite to the first side;
    a first semiconductor region of the first conductivity type, and being selectively provided in a surface layer of the second side of the second semiconductor layer;
    a second semiconductor region of the second conductivity type, and being selectively provided in the surface layer of the second side of the first semiconductor layer, the second semiconductor region being disposed from a periphery of the active region to the termination region, the second semiconductor region extending along each of four sides of the active region;
    a gate insulating film disposed on an area of the second semiconductor layer between the first semiconductor region and the first semiconductor layer;
    a gate electrode having a stripe-shape, provided on the gate insulating film;
    a first electrode provided on the first semiconductor region and the second semiconductor layer;
    a second electrode provided on the rear surface of the silicon carbide semiconductor substrate; and
    a gate runner electrically connected to the gate electrode, wherein at the four sides of the active region, cross-sectional structures of the first and second semiconductor layers and the first and second semiconductor regions are identical to one another.

2. The silicon carbide semiconductor device according to claim 1, further comprising a plurality of gate contact regions, each of which connects the gate electrode and the gate runner, the periphery at each of the four sides of the rectangle-shaped active region including at least one of the gate contact regions.

3. The silicon carbide semiconductor device according to claim 2, wherein
    the four sides of the rectangle-shaped active region includes two shorter sides and two longer sides, the periphery at each longer side of the rectangle-shaped active region includes a total number of the contact regions greater than a total number of the contact regions included in the periphery at each shorter side of the active region.

4. The silicon carbide semiconductor device according to claim 2, wherein
    the four sides of the rectangle-shaped active region includes shorter sides and longer sides, a total area of the contact regions included in the periphery at each longer side of the active region is greater than a total area size of the contact regions included in the periphery at each shorter side of the active region.

5. The silicon carbide semiconductor device according to claim 1, further comprising a plurality of gate pads, each of which connects the gate runner to the gate electrode, and being disposed at the periphery of a corresponding one of the four sides of the rectangle-shaped active region.

6. A method of manufacturing a silicon carbide semiconductor device having a rectangle-shaped active region in which a main current flows during an ON state of the device, and a termination region surrounding the active region in a plan view of the device, the method comprising:
    forming on a front surface of a silicon carbide semiconductor substrate of a first conductivity type, a first semiconductor layer of the first conductivity type, and having an impurity concentration lower than an impurity concentration of the silicon carbide semiconductor substrate, the first semiconductor layer having a first side facing the main surface of the silicon carbide semiconductor substrate and a second side opposite to the first side;
    forming at a surface of the second side of the first semiconductor layer, a second semiconductor layer of a second conductivity type, the second semiconductor layer having a first side facing the main surface of the silicon carbide semiconductor substrate and a second side opposite to the first side;
    selectively forming in a surface layer on the second side of the second semiconductor layer, a first semiconductor region of the first conductivity type;
    selectively forming in the surface layer on the second side of the first semiconductor layer, a second semiconductor region of the second conductivity type to be disposed from a periphery of the active region to the termination region, the second semiconductor region extending along each of the four sides of the active region;
    forming a gate insulating film on an area of the second semiconductor layer between the first semiconductor region and the first semiconductor layer;
    forming on the gate isolating film a gate electrode having a striped shape;
    forming a first electrode on the first semiconductor region and the second semiconductor layer;
    forming a second electrode on the rear surface of the silicon carbide semiconductor substrate; and
    forming a gate runner that is electrically connected to the gate electrode, wherein
    at the four sides of the active region, cross-sectional structures of the first and second semiconductor layers and the first and second semiconductor regions are identical to one another.

* * * * *